US012009755B2

(12) United States Patent
Yasuda

(10) Patent No.: US 12,009,755 B2
(45) Date of Patent: Jun. 11, 2024

(54) HIGH-FREQUENCY POWER SUPPLY DEVICE

(71) Applicant: SHIMADZU CORPORATION, Kyoto (JP)

(72) Inventor: Naoki Yasuda, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 8 days.

(21) Appl. No.: 17/581,039

(22) Filed: Jan. 21, 2022

(65) Prior Publication Data
US 2022/0239229 A1 Jul. 28, 2022

(30) Foreign Application Priority Data

Jan. 28, 2021 (JP) ................................. 2021-011930

(51) Int. Cl.
*H02M 3/338* (2006.01)
*H01J 37/32* (2006.01)
(Continued)

(52) U.S. Cl.
CPC ......... *H02M 3/3385* (2013.01); *H01J 37/321* (2013.01); *H01J 37/32174* (2013.01);
(Continued)

(58) Field of Classification Search
CPC ......... H02M 3/33507; H02M 3/33523; H02M 3/33592; H02M 1/08; H02M 1/0032; H02M 1/32; H02M 3/3385; H02M 3/01
See application file for complete search history.

(56) References Cited

U.S. PATENT DOCUMENTS 3,927,332 A 12/1975 Mckeon et al.
2007/0080903 A1* 4/2007 Lee ...................... G09G 3/2932
345/68
(Continued)

FOREIGN PATENT DOCUMENTS

JP S48-073057 A 10/1973
JP S51-109714 9/1976
(Continued)

OTHER PUBLICATIONS

Office Action dated Nov. 14, 2023 for corresponding Japanese Patent Application No. 2021-011930.

*Primary Examiner* — Wei (Victor) Y Chan
(74) *Attorney, Agent, or Firm* — Muir Patent Law, PLLC

(57) ABSTRACT

Provided is a high-frequency power supply device capable of causing an appropriate current to flow through a transformer. A self-oscillation high-frequency power supply device is provided with a DC power supply, an LC resonant circuit, a switching circuit, and a transformer. The LC resonant circuit includes an induction coil for plasma generation and a capacitor. The switching circuit includes a semiconductor element, the switching circuit being configured to subject DC power supplied from the DC power supply to switching processing to supply high-frequency power to the LC resonant circuit. The transformer includes a primary coil included in the LC resonant circuit and a secondary coil connected to the semiconductor element to turn on/off a semiconductor element. The transformer has a coaxial structure in which the primary coil and the secondary coil are coaxially provided. The LC resonant circuit includes a resistor connected in parallel to the primary coil.

5 Claims, 9 Drawing Sheets

(51) Int. Cl.
*H02M 7/00* (2006.01)
*H02M 7/48* (2007.01)
*H02M 7/5383* (2007.01)

(52) U.S. Cl.
CPC ......... *H02M 7/003* (2013.01); *H02M 7/4815* (2021.05); *H02M 7/4818* (2021.05); *H02M 7/5383* (2013.01)

(56) References Cited

U.S. PATENT DOCUMENTS

| | | | | |
|---|---|---|---|---|
| 2014/0078785 | A1* | 3/2014 | Nishijima | H02M 3/33576 363/21.01 |
| 2016/0066404 | A1* | 3/2016 | Habu | H05H 1/36 315/223 |
| 2019/0333692 | A1* | 10/2019 | Beck | H02J 50/12 |
| 2020/0343872 | A1* | 10/2020 | Nowosad | H02J 3/01 |
| 2021/0051793 | A1* | 2/2021 | Rogers | H02M 7/003 |

FOREIGN PATENT DOCUMENTS

| | | |
|---|---|---|
| JP | H04-322108 A | 11/1992 |
| JP | 2015-023720 A | 2/2015 |
| JP | 2016051556 A | 4/2016 |

* cited by examiner

HIGH-FREQUENCY POWER SUPPLY DEVICE

CROSS-REFERENCE TO RELATED APPLICATIONS

This application claims priority under 35 U.S.C. § 119 to Japanese Patent Application No. 2021-011930 filed on Jan. 28, 2021, the entire disclosure of which is incorporated herein by reference in its entirety.

BACKGROUND OF THE INVENTION

Field of the Invention

The present invention relates to a self-oscillation high-frequency power supply device.

Description of the Related Art

An example of a conventional self-oscillating high-frequency power source device is disclosed in Patent Document 1. The transformer of the high-frequency power supply device disclosed in Patent Document 1 is configured such that the primary coil and the secondary coil is formed in a coaxial configuration. The semiconductor of the high-frequency power supply device is driven by a voltage applied via the transformer.

PRIOR ART DOCUMENT

Patent Document

Patent Document 1: Japanese Unexamined Patent Application Publication No. 2016-51556

SUMMARY OF THE INVENTION

Problems to be Solved by the Invention

In the above-described high-frequency power supply device, it is preferable to separately provide a configuration for appropriately setting the current flowing through the transformer because it is difficult to adjust the turn ratio of the primary coil to the secondary coil due to the structure of the transformer.

The present invention has been made in view of the above-described circumstances. An object of the present invention is to provide a high-frequency power supply device capable of causing an appropriate current to flow through a transformer while suppressing an excessive current from flowing through the transformer.

Means for Solving the Problem

According to a first aspect of the present invention, the present invention relates to a self-oscillation high-frequency power supply device equipped with a DC power supply, an LC resonant circuit, a switching circuit, and a transformer. The LC resonant circuit includes an induction coil for plasma generation and a capacitor. The switching circuit includes a semiconductor element, the switching circuit being configured to subject DC power supplied from the DC power supply to switching processing to supply high-frequency power to the LC resonant circuit. The transformer includes a primary coil included in the LC resonant circuit and a secondary coil connected to the semiconductor element to turn on/off the semiconductor element. The transformer is formed in a coaxial structure in which the primary coil and the secondary coil are coaxially provided. The LC resonant circuit includes a resistor connected in parallel to the primary coil.

Effects of the Invention

According to the first aspect of the present invention, the resistor is connected in parallel to the primary coil of the transformer. Therefore, it is possible to cause an appropriate current to flow through the transformer while suppressing an excessive current from flowing through the transformer.

DESCRIPTION OF THE EMBODIMENTS

1. Electrical Configuration of High-Frequency Power Supply Device

Figure 1:
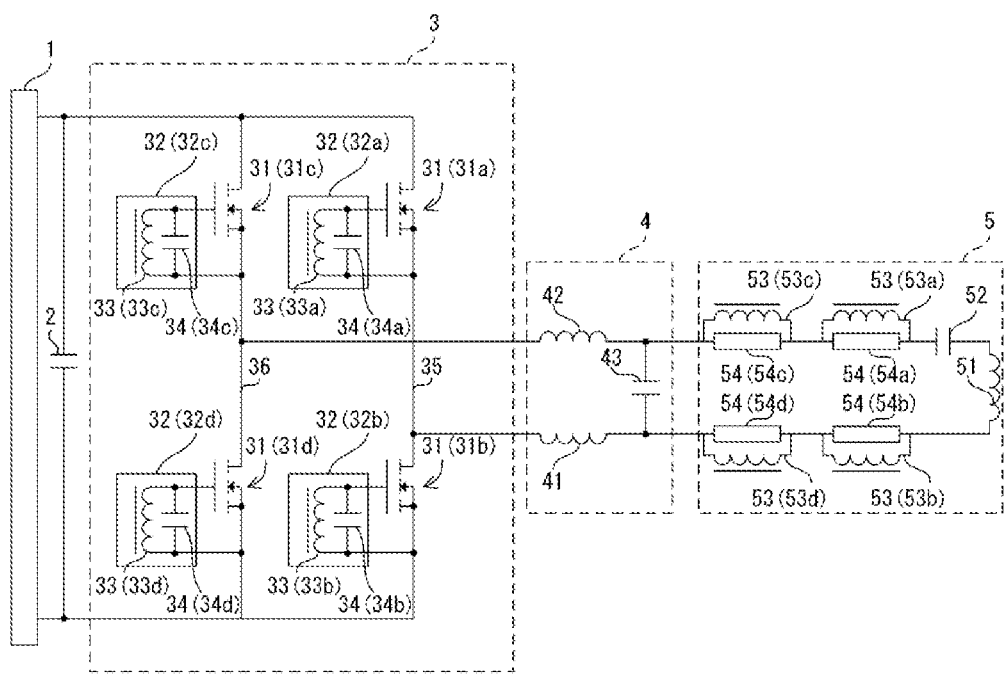
FIG. 1 is a schematic diagram showing a configuration example of a high-frequency power supply device of this embodiment.

FIG. 1 is a circuit diagram showing a configuration example of a high-frequency power supply device according to this embodiment. This high-frequency power supply device is applicable to an analyzer, such as, e.g., an inductively coupled plasma (ICP) emission analyzer. This high-frequency power supply device is a self-oscillation high-frequency power supply device and is provided with a DC power supply 1, a by-pass capacitor 2, a switching circuit 3, an impedance conversion circuit 4, an LC resonant circuit 5, and the like.

The DC power supply 1 is configured to set a DC voltage of the switching circuit 3 and determines high-frequency power to be supplied to the LC resonant circuit 5. The by-pass capacitor 2 is provided between the DC power supply 1 and the switching circuit 3 to ensure a low-impedance and high-frequency current path.

The LC resonant circuit 5 includes an induction coil 51 and a capacitor 52 connected to the induction coil 51. The induction coil 51 included in the LC resonant circuit 5 is for plasma generation. By supplying high-frequency power to the induction coil 51 from the DC power supply 1 via the switching circuit 3, plasma can be generated at the plasma torch (not illustrated).

The impedance conversion circuit 4 includes two coils 41 and 42 and a capacitor 43 connected in series between these coils 41 and 42. Between the switching circuit 3 and the impedance conversion circuit 4, a loop including the coils 41 and 42 and the capacitor 43 of the impedance conversion circuit 4 is formed. Further, between the impedance conversion circuit 4 and the LC resonant circuit 5, a loop including the capacitor 43 of the impedance conversion circuit 4 and the induction coil 51 and the capacitor 52 of the LC resonant circuit 5 is formed.

The switching circuit 3 is configured to include semiconductor elements and is connected to the DC power supply 1 via the semiconductor elements. In this example, the switching circuit 3 is configured by a bridge circuit including four MOSFETs (Metal Oxide Semiconductor Field-Effect Transistors) 31 (31a, 31b, 31c, 31d). The switching circuit 3 is configured by a bridge circuit of a half-bridge type or a full-bridge type. Note that the semiconductor element included in the switching circuit 3 is not limited to a MOSFET. Further note that the switching circuit 3 is not limited to a half-bridge type or a full-bridge type.

Between the drain electrode of the MOSFET 31a and the source electrode of the MOSFET 31b, the DC power supply 1 and the by-pass capacitor 2 are connected. Further, the source electrode of the MOSFET 31a and the drain electrode of the MOSFET 31b are connected by a wiring 35, and a coil 41 of the impedance conversion circuit 4 is connected to the middle portion of the wiring 35.

Between the drain electrode of the MOSFET 31c and the source electrode of the MOSFET 31d, the DC power supply 1 and the by-pass capacitor 2 are connected. Further, the source electrode of the MOSFET 31c and the drain electrode of the MOSFET 31d are connected by a wiring 36, and the coil 42 of the impedance conversion circuit 4 is connected to the middle portion of the wiring 36.

A gate drive circuit 32 (32a, 32b, 32c, 32d) is connected to a gate electrode of each MOSFET 31a, 31b, 31c, 31d. Thus, the MOSFET 31 is switched to the ON state or the OFF state at a predetermined timing by the gate drive circuit 32. Thus, it is possible to subject the DC power supplied from the DC power supply 1 to switching processing to provide high-frequency power to the LC resonant circuit 5.

Each gate drive circuit 32a, 32b, 32c, 32d is provided with a coil 33 (33a, 33b, 33c, 33d) and a capacitor 34 (34a, 34b, 34c, 34d) connected in parallel to each other. The coil 33 provided to the gate drive circuit 32 constitutes a secondary coil of each transformer and is connected to the control terminals (the gate electrode, the source electrode) of the MOSFET 31 to turn the MOSFET 31 on/off (switching). The primary coil of each transformer is constituted by a coil 53 (53a, 53b, 53c, 53d) included in the LC resonant circuit 5.

As described above, in this embodiment, the transformer configured by a pair of the coil 53 and the coil 33 is provided in association with each MOSFET 31, so that a feedback voltage can be supplied to each MOSFET 31.

Further, in this embodiment, the transformer is configured by the coil (primary coil) 53 and the coil (secondary coil) 33. Therefore, when an excessive current flows through the primary coil 53, an excessive current also flows through the secondary coil 33, which may adversely affect the MOSFET 31.

In this embodiment, as a configuration for appropriately setting the current flowing through the transformer, a resistor 54 (54a, 54b, 54c, 54d) is connected in parallel to each transformer, specifically each primary coil 53a, 53b, 53c, 53d. Further, the coil 53 and the resistor 54 connected in parallel are connected in series to the induction coil 51 and the capacitor 52.

The resistor 54 is an electric conductor having a resistance value. That is, the resistor 54 can also be said to be a current flow path having a resistance value. As the resistor 54, a metallic plate, a resistive element, and the like can be exemplified.

As described above, by connecting the resistor 54 in parallel to the primary coil 53, it is possible to cause an appropriate current to flow through the transformer while suppressing an excessive current from flowing through the transformer.

2. Internal Configuration of Transformer

Figure 2:
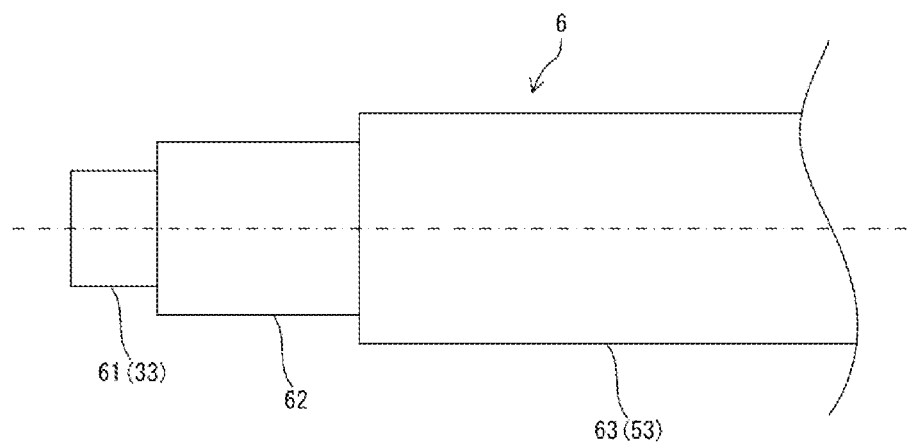
FIG. 2 is a schematic diagram for explaining an inner configuration of a transformer of this embodiment.

FIG. 2 is a schematic diagram for explaining the inner configuration of the transformer 6 of this embodiment. The transformer 6 is configured by the primary coil 53 provided in the LC resonant circuit 5 and the secondary coil 33 provided in the gate drive circuit 32.

In this embodiment, the transformer 6 is configured by a semi-rigid coaxial cable. The semi-rigid coaxial cable is coaxially provided with a linear center conductor 61, a cylindrical insulator 62 covering the outer side of the center conductor 61, and a cylindrical outer conductor 63 covering the outer side of the insulator 62. The primary coil 53 of the transformer 6 is configured by the outer conductor 63, and the secondary coil 33 is configured by the center conductor 61.

With this, the transformer 6 is formed in a coaxial structure in which the primary coil 53 and the secondary coil 33 are coaxially provided, and even in a case where the transformer 6 is curbed or bent, the state in which the primary coil 53 and the secondary coil 33 are arranged in parallel to each other is maintained. Note that it may be configured such that the primary coil 53 of the transformer 6 is configured by the center conductor 61 and that the secondary coil 33 is configured by the outer conductor 63.

3. Configuration Around MOSFET

Figure 3:
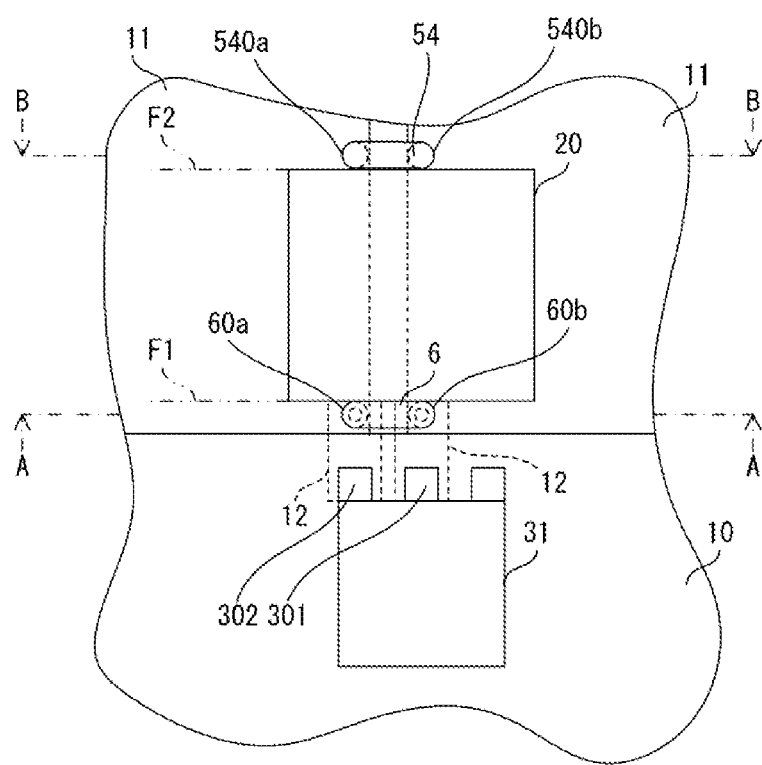
FIG. 3 is an example of a partial plan view showing a configuration example of a MOSFET and therearound of this embodiment.
Figure 4:
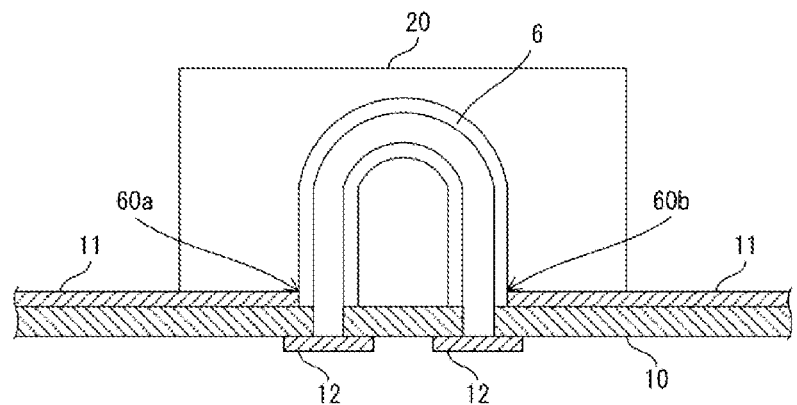
FIG. 4 is a cross-sectional view taken along the line A-A in FIG. 3.

FIG. 3 is an example of a partial plan view showing a configuration example of the MOSFET 31 and therearound of this embodiment. FIG. 4 is a cross-sectional view taken along the line A-A in FIG. 3. Further, FIG. 5 is a cross-sectional view taken along the line B-B in FIG. 3.

Figure 5:
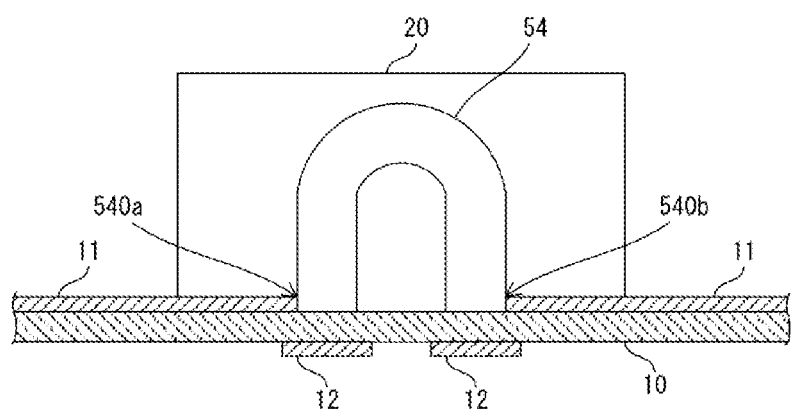
FIG. 5 is a cross-sectional view taken along the line B-B in FIG. 3.

Further, although only the configuration of the periphery of one of MOSFETs 31 out of the MOSFET 31a, etc., is shown in FIG. 3 to FIG. 5, the same configuration is applied to the configuration of the periphery of each MOSFET 31.

In this embodiment, each circuit, such as, e.g., the switching circuit 3, the impedance conversion circuit 4, and the LC resonant circuit 5, is mounted on the circuit board 10. The components included in each circuit are electrically connected to each other by pattern wirings 11 and pattern wirings 12. The current flowing through the induction coil 51 for plasma generation is very large. Therefore, if the width of the pattern wiring 11 is too small, too large heat is generated, which is unacceptable. Therefore, it is preferable to use a wide pattern as the pattern wiring 11. Note that the circuit board 10 may be a single sheet or may be divided into two or more sheets.

Each transformer 6 is formed in a U-shape. The U-shape means a shape in which it is curved or bent such that both the ends 60a and 60b of the transformer 6 are closely arranged to each other, which is a conception including other shapes formed substantially in a U-shape such as a semicircular shape. The transformer 6 configured by a semi-rigid coaxial cable does not have a protective covering on the outer side of the outer conductor 63 and is in a state in which the outer conductor 63 is exposed. The primary coil 53 of each transformer 6 is connected to the pattern wiring 11. On the other hand, the input end (IN) and the output end (OUT) of the secondary coil 33 of the transformer 6 and the control terminals of the MOSFET 31 (the gate electrode 301, the source electrode 302) are electrically connected by a pattern wiring 12 on a side opposite to the side of the pattern wiring 11 on the circuit board 10.

Further, in this embodiment, the transformer 6 is formed in a U-shape. Thus, it is possible to suppress the attenuation of the feedback voltage due to the pattern inductance by shortening the pattern wiring 12 between the input end (IN) and the output end (OUT) of the secondary coil 33 of the transformer 6 and the control terminal (the gate electrode 301, the source electrode 302) of the MOSFET 31 while securing the length capable of generating a sufficient feedback voltage. Further, by placing the primary coil 53 and the secondary coil 33 of the transformer 6 parallel, the degree of coupling of the primary coil 53 and the secondary coil 33 increases.

With these structural improvements, a sufficient feedback voltage can be supplied to the MOSFET 31 via the transformer 6. That is, it is possible to provide a sufficient current to each MOSFET 31 via the transformer 6.

As described above, the feedback voltage can be increased, and therefore, this embodiment eliminates the need to apply a DC bias voltage to the control terminal of each MOSFET 31. That is, in a case where the semiconductor element of the switching circuit 3 is configured by the MOSFETs 31 as in this embodiment, the amplitude of the gate voltage of each MOSFET 31 can be increased, thereby eliminating the necessity to apply a DC bias voltage to the gate electrode of each MOSFET 31.

Furthermore, as shown in FIG. 1, by connecting the secondary coil 33 and the capacitor 34 in parallel to the control terminals of the MOSFET 31, it is possible to reduce the variations of the gate-source capacitance of each MOSFET 31 and the effects of variations thereof. Further, the voltage of the control terminal of each MOSFET 31 having a nonlinear gate charging characteristic changes more linearly, thereby suppressing the ringing of the switching waveform due to the inductance of the load, which enables to realize a high-power supply efficiency.

Further, in this embodiment, as shown in FIG. 3 and FIG. 5, each resistor 54 is connected to the pattern wiring 11. The transformer 6 is formed in a coaxial structure in which the primary coil 53 and the secondary coil 33 are arranged coaxially, and therefore, it is difficult to adjust the magnitude of the current flowing through the primary coil 53 and the secondary coil 33 by adjusting the winding ratio thereof. However, for example, by simply replacing the resistor 54 to another resistor 54 having a different resistance value, it is possible to easily adjust the magnitude of the current flowing through the primary coil 53 and the secondary coil 33.

Further, the resistor 54 differs in the resistance value when the length of the current flow path differs even in the case of using an electric conductor of the same material. Specifically, even in the case of using an electrical conductor of the same material, an electrical conductor having a longer current flow path is larger in resistance. Therefore, in an electric conductor of a given material, the longer the current path of the resistor 54, the greater the resistance of the resistor 54.

Like this embodiment, in a case where the resistor 54 is formed in a U-shape in the same manner as in the transformer 6, for example, even if the connecting positions of the end portions 540a and 540b of the resistor 54 are arranged closely to each other, an adequate resistance value can be secured.

Further, the resistor 54 differs in resistance value if the cross-sectional area of the current flow path differs even in the case of using an electric conductor of the same material. Specifically, even in the case of using an electrical conductor of the same material, an electrical conductor smaller in the cross-sectional area of the current flow path is larger in the resistance value. Therefore, in an electric conductor of a predetermined material, the smaller the cross-sectional area of the current path of the resistor 54, the larger the resistance of the resistor 54.

As will be apparent from the above, the resistance value of the resistor 54 is determined by the material and the shape. Note that in this embodiment, in a case where the resistance value of the resistor 54 is extremely smaller than the value of the parasitic resistance of the primary coil 53, the magnitude of the current flowing through the resistor 54 increases. In other words, the current flowing through the primary coil 53 becomes extremely small. In this case, there is a possibility that the voltage (current) required to drive the MOSFET 31 is not supplied to the MOSFET 31.

In this embodiment, as shown in FIG. 3 to FIG. 5, the resistor 54 is formed in a U-shape similar to the transformer 6, but the material and the shape of the resistor 54 are not particularly limited as long as a voltage equal to or greater than the minimum voltage required to drive the MOSFET 31 is supplied.

Further, as shown in FIG. 3 to FIG. 5, in this embodiment, the transformer 6 and the resistor 54 extend in parallel to each other in a state of facing each other. The insulating heat sink 20 is located between the transformer 6 and the resistor 54 and is in contact with the transformer 6 and the resistor 54.

Each of the transformer 6 and the resistor 54 is curved or bent in mutually parallel planes F1 and F2 and is in contact with the heat sink 20 in these planes F1 and F2.

4. Modification of Heat Sink and LC Resonant Circuit

Figure 6:
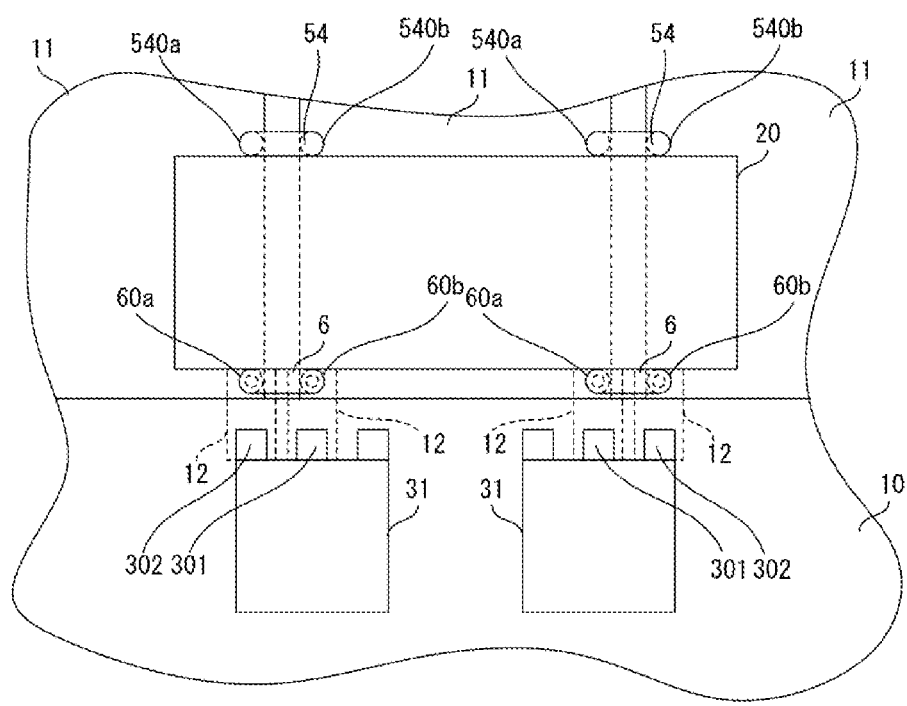
FIG. 6 is another example of a partial plan view showing a configuration example of a MOSFET and therearound of this embodiment.

As shown in FIG. 3 to FIG. 5, a single heat sink 20 may be in contact with a single pair of the transformer 6 and the resistor 54 on the circuit board 10. Alternatively, as shown in FIG. 6, a single heat sink 20 may be in contact with a plurality of pairs of the transformer 6 and the resistor 54. Note that FIG. 6 shows another example of a partial plan view showing the configuration example of the MOSFETs 31 and therearound according this embodiment. Specifically, FIG. 6 shows the configuration of the two MOSFET 31 and MOSFET 31 out of the MOSFET 31a and the like.

Figure 7:
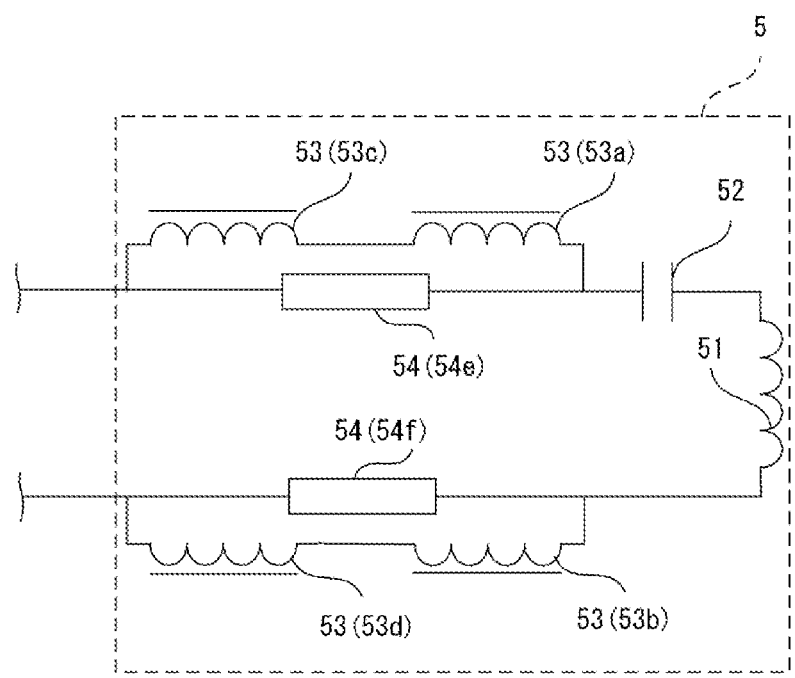
FIG. 7 is an example of a circuit diagram showing a configuration example of an LC resonant circuit.
Figure 8:
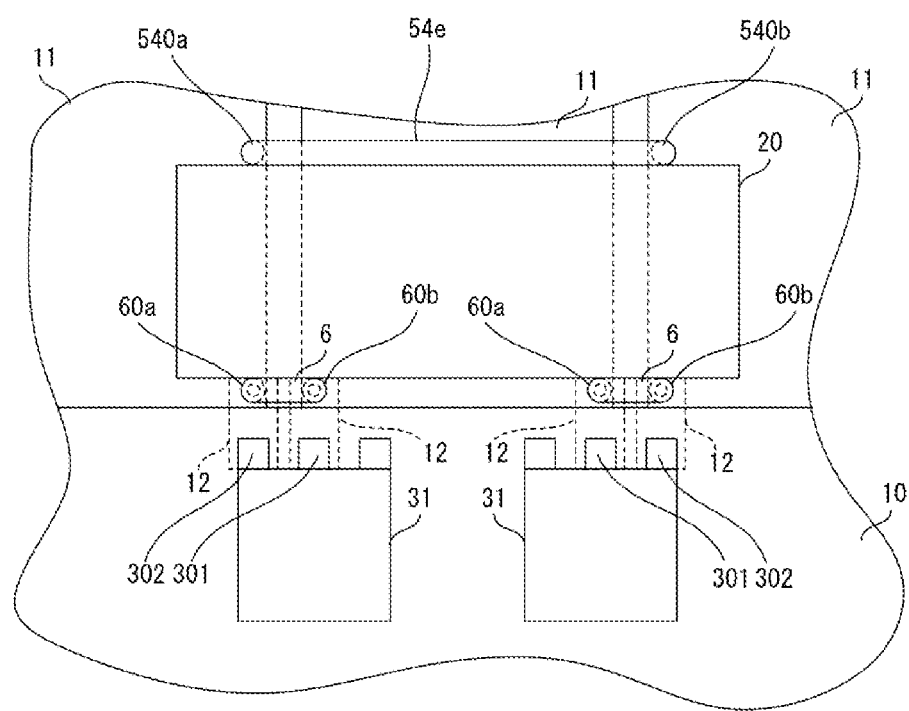
FIG. 8 is still another example of a partial plan view showing a configuration example of a MOSFET and therearound of this embodiment.

Further, as in the LC resonant circuit 5 shown in FIG. 7, the resistor 54 may be connected in parallel to a plurality of primary coils 53. For example, as shown in FIG. 7, in a case where the resistor 54 is connected in parallel to two primary coils 53, the periphery of the MOSFETs 31 can be configured as shown in FIG. 8. Note that FIG. 7 is an example of the circuit diagram showing a configuration example of the LC resonant circuit 5. Further, FIG. 8 is still another example of a partial plan view showing the configuration example of the MOSFETs 31 and therearound of this embodiment. Furthermore, in FIG. 8, it specifically shows the configuration of the periphery of the two MOSFETs 31 out of the MOSFET 31a and the like.

As will be understood from the above, in this embodiment, as long as the heat sink 20 is provided on the circuit board 10, it is possible to cool the respective transformers 6 and the respective resistors 54 by at least a single heat sink 20.

The heat sink 20 is configured by, for example, a block made of aluminum nitride. However, the heat sink 20 may be made of a material other than aluminum nitride as long as the material has high thermal conductivity and is an insulating material.

In this embodiment, since the transformer 6 is configured by a coaxial cable, the outer surface of the transformer 6 is a circumferential surface. Therefore, in a case where the contact surface of the heat sink 20 which comes in contact with the transformer 6 is formed in a flat surface, the heat sink 20 comes in contact with only a small part of the coaxial cable, which may result in insufficient heat dissipation. For this reason, it is preferable to increase the contact area between the heat sink 20 and the transformer 6, for example, by applying a thermal grease to the periphery of the contact portion between the transformer 6 and the heat sink 20, or by making the contact surface of the heat sink 20 that comes into contact with the transformer 6 to be a concave surface corresponding to the outer surface of the transformer 6. The same applies to the resistor 54.

5. Overall Configuration of High-Frequency Power Supply Device

Figure 9:
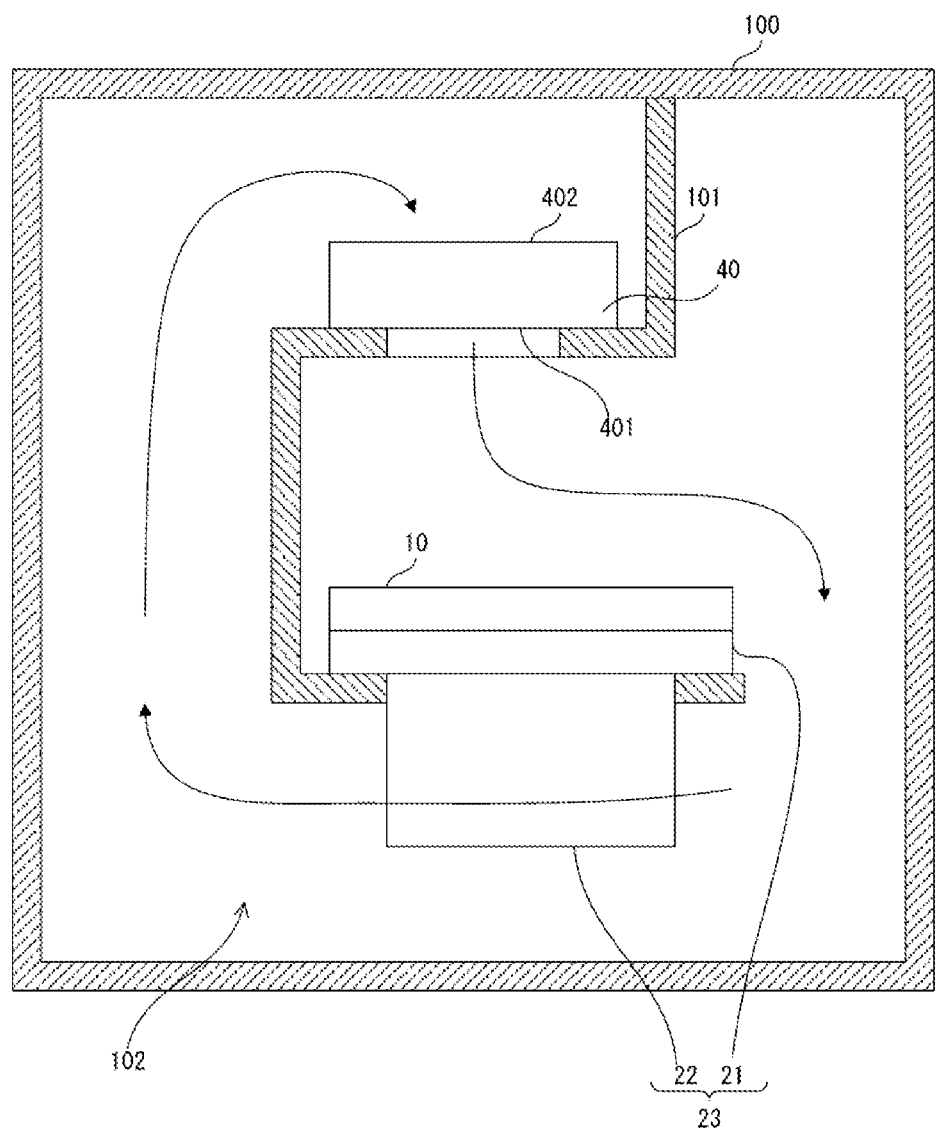
FIG. 9 is a schematic cross-sectional diagram showing an overall configuration of the high-frequency power supply device shown in FIG. 1.

FIG. 9 is a schematic cross-sectional view illustrating the overall configuration of the high-frequency power supply device of FIG. 1. This high-frequency power supply device has a configuration provided with various components in a hollow housing 100. The housing 100 is provided with an insertion hole for inserting cables but not provided with other openings, and therefore, the housing 100 is substantially in a sealed state. That is, the housing 100 is not provided with other openings, such as, e.g., an inlet for sucking air into the housing 100 and an outlet for discharging air from the housing 100.

The space within the housing 100 is partitioned by one or more partition walls 101. The circuit board 10 on which circuits, such as, e.g., the switching circuit 3, the impedance conversion circuit 4, and the LC resonant circuit 5, are mounted is held by, for example, the partition walls 101. Thus, various components, such as, e.g., the switching circuit 3, the LC resonant circuit 5, and the transformer 6, are accommodated in the housing 100.

Note that the induction coil 51 included in the LC resonant circuit 5 is not accommodated in the housing 100 but is disposed inside a plasma stand (not illustrated). The circuit board 10 accommodated in the housing 100 and the induction coil 51 provided outside the housing 100 are connected by an electric conductor, such as, e.g., a copper plate. The induction coil 51 and the plasma stand are partitioned by an insulator, such as, e.g., fluoropolymer.

The heat sink 23 provided in the housing 100 is mounted on the circuit board 10. The heat sink 23 is, for example, a water-cooled system and is provided with a main body portion 21 through which a refrigerant flows and a plurality of heat dissipation fins 22 protruding from the main body portion 21. The heat sink 23 mainly cools the MOSFETs 31 mounted on the circuit board 10. The main body portion 21 may be brought into contact with, for example, the circuit board 10 to cool the circuit board 10 and the components mounted on the circuit board 10. However, it is insufficient because the heat dissipation is performed via the insulating material of the circuit board 10.

For this reason, in the housing 100, in addition to the circuit board 10 and the heat sink 23 described above, an air cooling fan 40 is provided. The air cooling fan 40 is held by, for example, a partition wall 101 and faces a side of the circuit board 10 opposite to the heat sink 23 side. Thus, when the air cooling fan 40 is rotationally driven, the air in the housing 100 is blown from the air cooling fan 40 against the circuit board 10.

The space in the housing 100 partitioned by the partition wall 101 constitutes a circulation path 102 for circulating the air in the housing 100. That is, the air blown out of the outlet 401 of the air cooling fan 40 is exposed to the circuit board 10 and the heat sink 23 provided in the middle of the circulation path 102, sucked by the air cooling fan 40 via the inlet 402, and then blown out of the outlet 401 again.

The plurality of heat dissipation fins 22 provided to the heat sink 23 each extends along the flow direction of the air in the circulation path 102 and is arranged in parallel to each other with a space therebetween. As described above, the heat sink 23 (heat dissipation fin 22) is arranged in the middle of the circulation path 102, and therefore, it is possible to circulate the air in the housing 100 by the air cooling fan 40 while guiding the air to the heat sink 23.

As described above, in this embodiment, components, such as, e.g., the LC resonant circuit 5 except for the induction coil 51, the switching circuit 3, and the transformer 6, are accommodated in the housing 100, and the air in the housing 100 is circulated by the air cooling fan 40. Therefore, the air outside the device is less likely to flow into the device. Thus, it is possible to prevent the components in the device from being contaminated by the air outside the device.

In addition, the components in the housing 100 are cooled by the water-cooled heat sink 23, and the air to be circulated in the housing 100 by the air cooling fan 40 is circulated while being cooled by the water-cooled heat sink 23. Therefore, high-efficiency cooling can be realized. For this reason, even in a configuration in which the air outside the device is less likely to flow into the device, it is possible to cool the components in the device well.

6. Other Modification

In the above-described embodiment, an example is described in which the LC resonant circuit 5 having the induction coil 51 is configured by the series resonant circuit in which the capacitor 52 is connected in series to the induction coil 51. However, the present invention is not limited to such a configuration, and the LC resonant circuit 5 may be configured by a parallel resonant circuit in which the capacitor 52 is connected in parallel to the induction coil 51.

The transformer 6 is not limited to a configuration constituted by a semi-rigid coaxial cable and may be constituted by other coaxial cables. In a case where a coaxial cable having a protective covering is used as the transformer 6, it is preferable to use it by removing the protective covering. However, the present invention is not limited to the configuration using a coaxial cable and may be configured such that only the primary coil 53 and the secondary coil 33 of the transformer 6 are arranged coaxially.

Further, as the resistor 54, a component provided to the high-frequency power supply device, specifically an electrically connectable component, i.e., a component having an electric conductivity and a resistance value may be used.

For example, in a case where the high-frequency power supply device is provided with a fan with a general-purpose metallic housing and, the fan with the general-purpose metallic housing is used as the resistor 54, by arranging the fan such that the heat sink 20 is exposed to the air blown out of the fan, the cooling efficiency of the heat sink 20 can be improved.

Further, in the plurality of circuit boards 10, even if various circuits are configured in the same manner, due to the differences in the qualities of the components, the value of the current flowing through the transformer 6 may differ slightly. In a case where a variable resistor is used as the resistor 54, even if the current flowing through the transformer 6 differs from the original value, it is possible to adjust the current flowing through the transformer 6 as appropriate without replacing the resistor 54. In other words, it is easy to maintain a certain level of quality in the production of the high-frequency power supply device.

The high-frequency power supply device according to the present invention is applicable not only to an ICP luminescence analyzer but also to other analyzers that perform an analysis using plasmas. Further, the high-frequency power supply device according to the present invention is applicable not only to an analyzer but also to other devices using plasma (e.g., high-frequency oscillation circuit for plasma CVD).

7. Aspects

It is understood by those skilled in the art that the embodiments described above are specific examples of the following aspects.

(Item 1)

A self-oscillation high-frequency power supply device, including:
- a DC power supply;
- an LC resonant circuit including an induction coil for plasma generation and a capacitor;
- a switching circuit including a semiconductor element, the switching circuit being configured to subject DC power supplied from the DC power supply to switching processing to supply high-frequency power to the LC resonant circuit, and
- a transformer including a primary coil included in the LC resonant circuit and a secondary coil connected to the semiconductor element to turn on/off the semiconductor element.

The transformer is formed in a coaxial structure in which the primary coil and the secondary coil are coaxially provided.

The LC resonant circuit includes a resistor connected in parallel to the primary coil.

According to the self-oscillation high-frequency power supply device as recited in the above-described Item 1, with the resistor connected in parallel to the primary coil of the transformer, it is possible to cause an appropriate current to flow through the transformer while suppressing an excessive current from flowing through to the transformer.

(Item 2)

In the self-oscillation high-frequency power supply device as recited in above-described Item 1,
the transformer and the resistor may be each formed in a U-shape.

According to the self-oscillation high-frequency power supply device as recited in the above-described Item 2, it is possible to suppress the attenuation of the feedback voltage due to the pattern inductance by shortening the wiring between the input end and the output end of the secondary coil of the transformer and the semiconductor while securing the length as long as possible to generate a sufficient feedback voltage. Further, it is possible to ensure a sufficient resistance value even if the connecting positions of the ends of the resistor are closely arranged.

(Item 3)

In the self-oscillation high-frequency power supply device as recited in above-described Item 1, it may be further provided with:
a heat sink with electrical insulation properties.

The heat sink may be in contact with both the transformer and the resistor.

According to the self-oscillation high-frequency power supply device as recited in the above-described Item 3, since the heat generation from the transformer and the resistor is dissipated through the heat sink, it is possible to achieve a high heat dissipation efficiency.

(Item 4)

In the self-oscillation high-frequency power supply device as recited in above-described Item 3,
the transformer and the resistor may extend in parallel to each other in a state of facing each other, and
the heat sink may be positioned between the transformer and the resistor.

According to the self-oscillation high-frequency power supply device recited in the above-described Item 4, it is possible to cool the transformer and the resistor with at least one heat sink.

(Item 5)

In the self-oscillation high-frequency power supply device as recited in any one of the above-described Items 1 to 4,
the resistor may be a variable resistor.

According to the self-oscillation high-frequency power supply device as recited in the above-described Item 5, it is possible to adjust the current flowing through the transformer without replacing the resistor.

The invention claimed is:

1. A self-oscillation high-frequency power supply device, comprising:
   a DC power supply;
   an LC resonant circuit including an induction coil for plasma generation and a capacitor;
   a switching circuit including a semiconductor element, the switching circuit being configured to subject DC power supplied from the DC power supply to switching processing to supply high-frequency power to the LC resonant circuit, and
   a transformer including a primary coil included in the LC resonant circuit and a secondary coil connected to the semiconductor element to turn on/off the semiconductor element,
   wherein the transformer is formed in a coaxial structure in which the primary coil and the secondary coil are coaxially provided, and
   wherein the LC resonant circuit includes a parallel circuit consisting only of the primary coil of the transformer and a resistor.

2. The self-oscillation high-frequency power supply device as recited in claim 1,
   wherein the transformer and the resistor are each formed in a U-shape.

3. The self-oscillation high-frequency power supply device as recited in claim 1, further comprising:
a heat sink with electrical insulation properties,
wherein the heat sink is in contact with both the transformer and the resistor.

4. The self-oscillation high-frequency power supply device as recited in claim 3,
wherein the transformer and the resistor extend in parallel to each other in a state of facing each other, and
wherein the heat sink is positioned between the transformer and the resistor.

5. The self-oscillation high-frequency power supply device as recited in claim 1,
wherein the resistor is a variable resistor.

* * * * *